United States Patent [19]

Ishikawa

[11] Patent Number: 4,540,902
[45] Date of Patent: Sep. 10, 1985

[54] SAMPLE AND HOLD CIRCUIT

[75] Inventor: Fumio Ishikawa, Atsugi, Japan

[73] Assignee: Sony Corporation, Tokyo, Japan

[21] Appl. No.: 452,750

[22] Filed: Dec. 23, 1982

[30] Foreign Application Priority Data

Dec. 28, 1981 [JP] Japan ................................ 56-214116

[51] Int. Cl.³ ..................... H03K 17/74; G11C 27/02
[52] U.S. Cl. .................................. 307/352; 307/257; 307/353; 328/151
[58] Field of Search ............... 307/257, 352, 353, 321; 328/151

[56] References Cited

U.S. PATENT DOCUMENTS

| | | | |
|---|---|---|---|
| 3,584,920 | 6/1971 | Sills ...................................... | 307/257 |
| 3,596,191 | 7/1971 | Stuckert .............................. | 307/257 |
| 3,597,633 | 8/1971 | Hirano et al. ........................ | 307/257 |
| 3,737,680 | 6/1973 | Uchida ................................ | 307/257 |

Primary Examiner—John Zazworsky
Attorney, Agent, or Firm—Lewis H. Eslinger; Alvin Sinderbrand

[57] ABSTRACT

A sample and hold circuit is disclosed, in which first and second terminals to which are supplied drive currents for turning ON and OFF a diode bridge are respectively connected through capacitors to a connection point between output electrodes of switching elements, a diode is connected between the first and second terminals for short-circuiting the capacitors when the diode bridge is made OFF, and input electrodes of the switching elements are respectively connected to first and second points of a reference potential whereby said diode bridge is made ON by a drive current flowing from the first point to the second point of the reference potential.

11 Claims, 8 Drawing Figures

SAMPLE AND HOLD CIRCUIT

BACKGROUND OF THE INVENTION

1. Field of the Invention

This invention relates generally to sample and hold circuits and particularly to a sample and hold circuit of a diode bridge type.

2. Description of the Prior Art

FIGS. 1 and 2 respectively show examples of a conventional sample and hold circuit. According to the conventional sample and hold circuit of FIG. 1, a pulse is supplied through a transformer in which series circuits of diodes D1, D2 and D3, D4 in a diode bridge circuit 1 are connected in parallel between one end and the other end of the secondary coil of the transformer. A connection point between a cathode of the diode D1 and an anode of the diode D2 is led out as an input terminal 10, while a connection point between a cathode of the diode D3 and an anode of the diode D4 is led out as an output terminal 11. Between the output terminal 11 and the ground is connected a capacitor 12 for holding. Accordingly, when the connection point between the anodes of the diodes D1 and D3 becomes at higher level than the connection point between the cathodes of the diodes D2 and D4, the diodes D1 to D4 in the diode bridge 1 are all made ON to connect the input terminal 10 with the output terminal 11 so that the output voltage equals to the input voltage. While, if the above relation of level is reversed, the diodes D1 to D4 are all made OFF to cut off between the input terminal 10 and the output terminal 11 so that charges stored in the capacitor 12 are held.

The circuitry shown in FIG. 1 employs the transformer and is therefore unsuitable for it to be formed as an integrated circuit (IC). For this reason, as shown in FIG. 2, there is proposed the sample and hold circuit in which the diode bridge 1 is driven by transistors 2 and 3 that are arranged as a differential amplifier. In this circuitry, a constant current source 4 for supplying a constant current $I_1$ is connected between a connection point of the emitters of the transistors 2 and 3 and the ground and switching pulses opposite in phase are respectively supplied to terminals 5 and 6 led out from the bases thereof whereby the transistors 2 and 3 differentially carry out switching operations. Resistors 7 and 8 are connected between each collector of the transistors 2 and 3 and a power source terminal 9 for a source voltage +Vcc.

With the afore-said circuitry shown in FIG. 2, if a potential at the terminal 5 is made higher than that at the terminal 6, the transistor 2 is made ON and the transistor 3 is made OFF so that current flowing through the resistors 7 and 8 and the diode bridge 1 flows through the transistor 2. Thus, all the diodes D1 to D4 in the diode bridge 1 are made ON and hence a voltage Vo at the output terminal 11 equals to an input voltage Vi at the input terminal 10.

Next, if the voltage at the terminal 5 is made lower than that at the terminal 6, all the diodes D1 to D4 in the diode bridge 1 are made OFF so that the output terminal 11 is cut off from the collectors of the transistors 2 and 3 thus the charges stored in the capacitor 12 are held.

By the way, it is noted that this circuitry has such a problem that stray capacities Cd including a junction capacity exist in parallel to the diodes D1 to D4 and this causes a pulse voltage to be leaked to the input and output terminals as an error voltage component.

This problem will be described below. When the diode bridge 1 is made ON, a collector voltage Va of the transistor 2 becomes Vo−Vf (where Vf represents the forward voltage of the diodes D1 to D4), while a collector voltage Vb of the transistor 3 becomes Vo+Vf. Next, when the diode bridge 1 is made OFF, the collector voltage Va of the transistor 2 is increased up to the source voltage Vcc, while the collector voltage Vb of the transistor 3 is lowered to Vm (=Vcc−$I_1$R8)(where R8 represents the resistance value of the resistor R8) so that an amplitude of the collector voltage Va of the transistor 2 which changes in association with ON and OFF of the diode bridge 1 becomes [Vcc−(Vo−Vf)], while an amplitude of the collector voltage Vb of the transistor 3 becomes [(Vo+Vf)−Vm]. The change of the amplitudes affects the output voltage Vo by way of the stray capacity Cd. If the capacitance value of the capacitor 12 for holding is taken as C, this error voltage component is given as:

$$[Vcc - (Vo - Vf)]\frac{Cd}{C+Cd} - [(Vo + Vf - Vm)]\frac{Cd}{C+Cd} = [Vcc - 2Vo + Vm]\frac{Cd}{C+Cd}$$

As is clear from this equation, the error voltage component varys with the magnitude of the output voltage Vo so that linearity becomes poor and hence this error voltage component can not be removed. Therefore, the component of the pulse voltage to be applied to the terminals 5 and 6 appears at the output terminal 11 so that precision of the output voltage Vo is lowered. Furthermore, unlike the circuitry using the transformer shown in FIG. 1, the circuit arrangement in FIG. 2 is required to flow the constant current $I_1$ at all times, leading to a large power consumption.

OBJECTS AND SUMMARY OF THE INVENTION

Accordingly, an object of this invention is to provide a sample and hold circuit which can obviate defects inherent in a conventional sample and hold circuit.

Another object of this invention is to provide a sample and hold circuit capable of the sampling operation on the basis of ON and OFF of a diode bridge in which a drive current is supplied to the diode bridge via a capacitor and charge stored in the capacitor is discharged by a switching element during the period where the diode bridge is made OFF.

According to an aspect of the present invention, there is provided a sample and hold circuit of a bridge type which includes first and second drive terminals to which drive currents each with an opposite phase are supplied, and a diode connected between an input terminal to which an input signal is supplied and an output terminal at which an output signal appears comprising a diode bridge, a holding capacitor, a drive current, supplying circuit, first and second capacitors respectively connected in series between said drive current supplying circuit and said first and second drive terminals, and a switching element connected between said first and second capacitors, wherein during the period where said diode bridge is made OFF, said switching element is made ON to discharge charges stored in said first and second capacitors.

The other objects, features and advantages of the present invention will become apparent from the following description taken in conjunction with the accompanying drawings through which the like references designate the same elements and parts.

DESCRIPTION OF THE PREFERRED EMBODIMENTS

Figure 3:
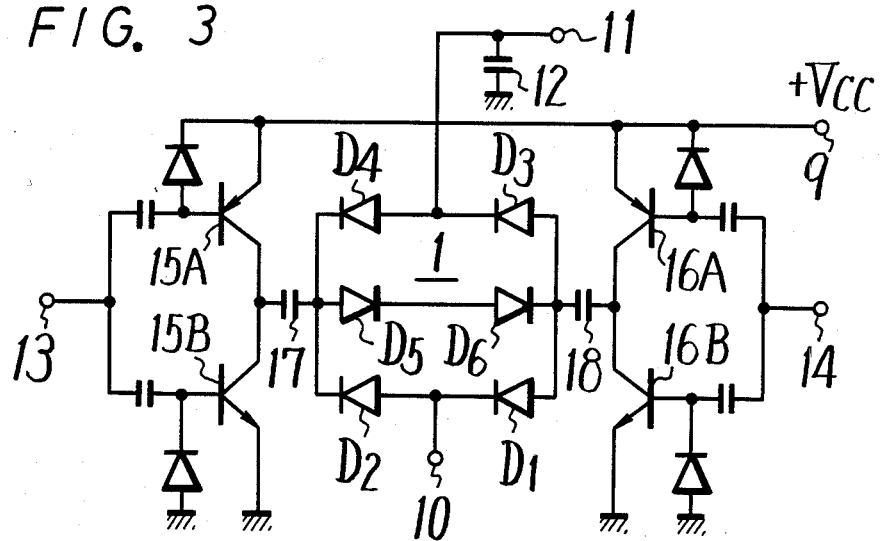
FIG. 3 is a circuit diagram showing an example of a sample and hold circuit according to this invention.

This invention will now be described with reference to the attached drawings. FIG. 3 is a circuit diagram showing an example of a sample and hold circuit according to the present invention. In FIG. 3, reference numerals 13 and 14 denote terminals to which differential pulse voltages are applied, respectively. The terminal 13 is connected through capacitors to bases of a PNP-type transistor 15A and an NPN-type transistor 15B, while the terminal 14 is connected through capacitors to bases of a PNP-type transistor 16A and an NPN-type transistor 16B. Emitters of the transistors 15A and 16A are connected together to a power source terminal 9, while emitters of the transistors 15B and 16B are grounded, respectively. A connection point between the collectors of the transistors 15A and 15B is connected to a connection point between cathodes of diodes D2 and D4 in a diode bridge 1 via a capacitor 17. While, a connection point between the collectors of the transistors 16A and 16B is connected to a connection point between anodes of diodes D1 and D3 in the diode bridge 1 via a capacitor 18 (whose capacity is same as that of the capacitor 17). Between both the connection points in the afore-said diode bridge 1 to which a drive current is applied is connected a series connection of diodes D5 and D6 which are connected in the direction opposite to each of the series connections of the diodes D1, D2 and D3, D4.

Figure 4:
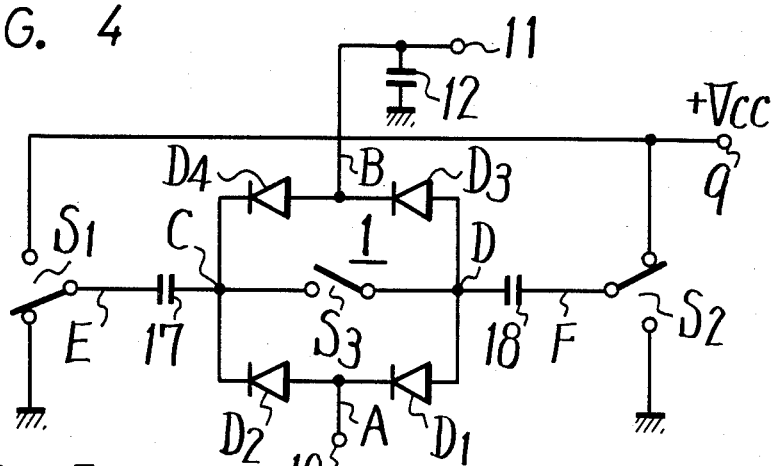
FIGS. 4 and 5 are an equivalent circuit diagram and a waveform diagram each used to explain the operation of the embodiment of this invention.
Figure 5:
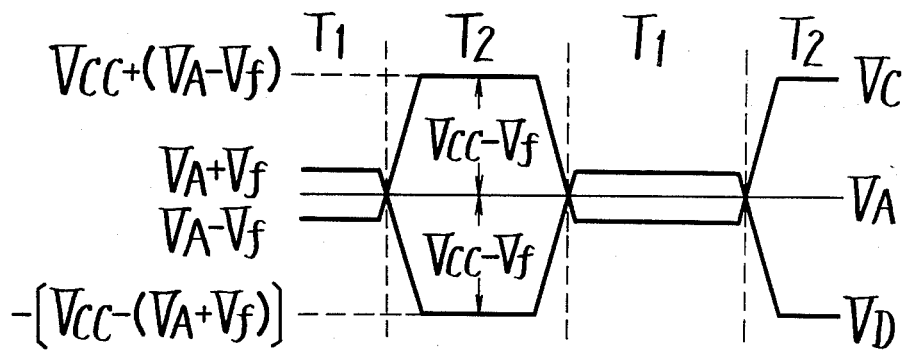

With the arrangement of the invention thus made, in response to the pulse voltages supplied to the terminals 13 and 14, time interval T1 during which the transistors 15B and 16A are made ON but the transistors 15A and 16B are made OFF and time interval T2 during which the transistors 15A and 16B are made ON but the transistors 15B and 16A are made OFF are repeated alternately. The pairs of the transistors 15A, 15B and 16A, 16B can equivalently be represented as switches S1 and S2 as illustrated in FIG. 4, respectively. While, the diodes D5 and D6 can also equivalently be represented as a switch S3. Referring to FIG. 4, the operation of this circuitry will be described in which a voltage at an input terminal 10 (point A) is taken as VA, an output terminal 11 is taken as a point B and other connection points are respectively taken as points C to F.

During time interval T1 in which the switch S1 is connected to the ground side and the switch S2 is connected to the power source side, the diode bridge 1 is made ON and the switch S3 (equal to the diodes D5 and D6) is made OFF so that the voltages at the respective points become as follows:

| A: VA | B: VA | C: VA − Vf |
|---|---|---|
| D: VA + Vf | E: ground | F: Vcc |
| C − E: VA − Vf | | D − F: VA + Vf − Vcc |

(where reference Vf represents a foward voltage drop of the diode). Next, during time interval T2 in which the switches S1 and S2 are changed in opposite position, namely, the switch S1 is connected to the power source side and the switch S2 is connected to the ground side, the switch S3 is turned ON so that a transient current flows through the capacitors 17 and 18, thus yielding the following voltages at the respective points:

| A: VA | B: VA | C: VA |
|---|---|---|
| D: VA | E: Vcc | F: ground |
| C − E: VA − Vcc | | D − F: VA |

If the diodes D5 and D6 are not connected, namely, the switch S3 is still made OFF even during time interval T2, the voltage VC at the point C becomes Vcc+(VA−Vf), while the voltage VD at the point D is given as −[Vcc−(VA+Vf)]. Here, as described above, the switch S3 is made ON to flow the transient current so as to discharge the capacitors 17 and 18 so that both the voltages VC and VD equal to the voltage VA. Thus, in subsequent time interval T1, a similar operation is repeated again so that the voltages at the points C and D become (VA−Vf) and (VA+Vf), respectively. Yet without connecting the diodes D5 and D6, the capacitors 17 and 18 would not be short-circuited and could not be discharged, and so this causes the correct operation not to be carried out.

As stated above, since the voltages at the points C and D are changed positively and negatively by the same voltage with the voltage VA as the center, the pulse voltage components each appearing at the input and output terminals 10 and 11 in association with the stray capacities Cd of the diodes D1 to D4 are cancelled to thereby prevent the error voltage component from occurring.

Figure 6:
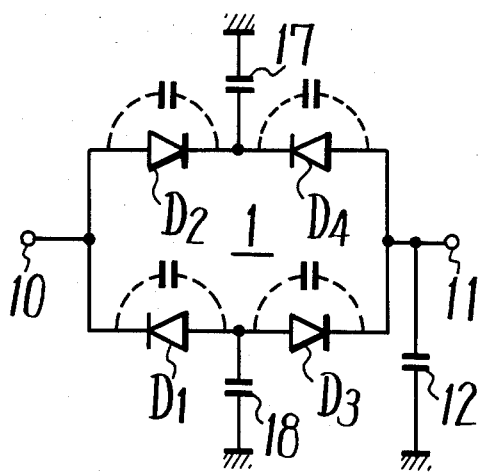
FIG. 6 is a circuit diagram useful for explaining the embodiment of this invention.

When the diode bridge 1 is made OFF where the switch S1 is connected to the power source side (grounded in view of alternate current) and the switch S2 is connected to the ground side, as shown in FIG. 6, there is formed a T-type attenuator comprising the respective stray capacities of the diodes D1 to D4 and the capacitors 17 and 18 between the input terminal 10 and the output terminal 11. Accordingly, even when the input signal has a relatively high frequency, it is possible to prevent the level change of this input signal from appearing through the stray capacities at the output terminal 11 during the holding interval.

Figure 7A:
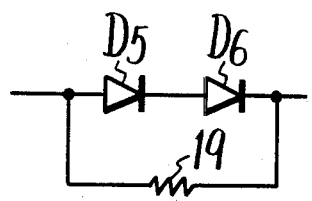
FIGS. 7A and 7B are respectively circuit diagrams showing another embodiment of this invention.

FIG. 7A shows another example the invention in which a resistor 19 is connected in parallel to the serially connected diodes D5 and D6.

Figure 7B:
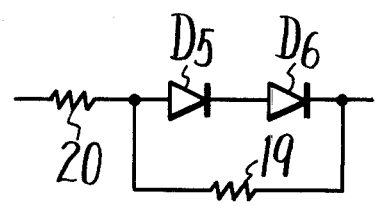

FIG. 7B shows a further example of the invention in which a resistor 20 is connected in series to the parallel connection of the serially connected diodes D5, D6 and the resistor 19.

Moreover, though not shown, two diodes D5 and D6 may be replaced by one diode. Furthermore, the transistors 15A, 15B, 16A and 16B may be replaced by field-effect transistors (FETs).

Figure 1:
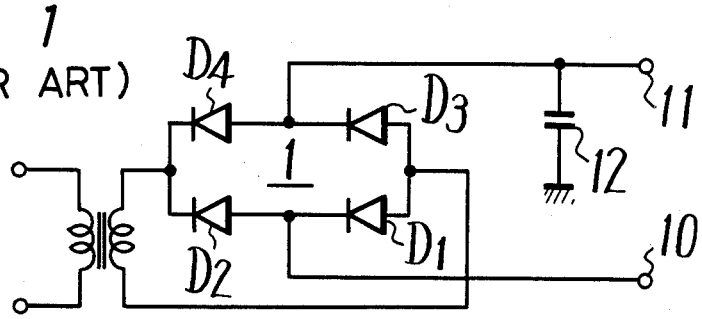
FIGS. 1 and 2 are circuit diagrams respectively showing examples of a conventional sample and hold circuit.
Figure 2:
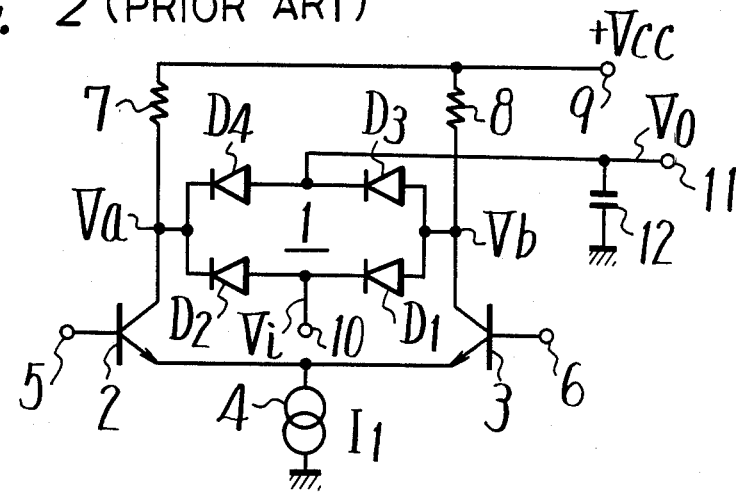

As is understood from the embodiments of this invention as set forth above, this invention can offer the following advantages as compared with the conventional sample and hold circuit shown in FIG. 1 or FIG. 2. Since no transformer is employed, the circuitry of this invention is suitable for IC. Moreover, since it is not necessary to supply the constant current at all times, this leads to more economy of power consumption. Furthermore, the pulse voltage component can be prevented from appearing at the input terminal or the output terminal and also the input signal can be prevented from appearing at the output terminal during the holding period, thus resulting in a sample-hold-output of remarkably high precision.

The above description is given on the preferred embodiments of the invention, but it will be apparent that many modifications and variations could be effected by one skilled in the art without departing from the spirit or scope of the novel concepts of the invention, so that the scope of the invention should be determined by the appended claims only.

I claim as my invention:

1. An integrated sample and hold circuit of the bridge type, comprising:
   a diode bridge, having an input terminal and an output terminal;
   first and second drive terminals on said bridge;
   first and second capacitors coupled to said first and second drive terminals respectively;
   first switching means having first and second states coupled between said first and second capacitors;
   second and third switching means for producing two control signals of opposite phase at respective outputs in response to input switching pulse signals of opposite phase;
   said output of said second and third switching means connected respectively to said first and second capacitors in series with said first and second drive terminals, respectively, for applying said control signals to said capacitors for turning said bridge ON and OFF;
   said first switching means being in said first state when said bridge is turned OFF and being in said second state when said bridge is turned ON;
   said capacitors establishing the voltage at both said drive terminals at a voltage equal to the voltage appearing at said input terminal in response to said first state of said first switching means; and
   said first capacitor establishing the voltage at said first drive terminal at a voltage equal to said input voltage plus a predetermined offset voltage and said second capacitor establishing the voltage at said second drive terminal at a voltage equal to said input voltage minus said predetermined offset voltage in response to said second state of said first switching means.

2. An integrated sample and hold circuit according to claim 1, wherein said switching means includes at least one diode.

3. An integrated sample and hold circuit according to claim 1, wherein said switching means includes a diode and a resistor.

4. An integrated sample and hold circuit according to claim 1, wherein said first state of said first switching means connects said first and second capacitors for discharging both said capacitors.

5. An integrated sample and hold circuit according to claim 4, wherein said control signals of opposite phase are each a two level signal having a first level equal to a control voltage and a second level equal to ground, one of said second and third switching means having said first level control signal applied thereto when the other of said second and third switching means has said second level control signal applied thereto.

6. An integrated sample and hold circuit according to claim 5, wherein said second and third switching means each include first and second transistors of complementary type with a common input, and output terminals of said first and second transistors of the respective switching means are connected at a connecting point to constitute said respective outputs.

7. An integrated sample and hold circuit according to claim 6, wherein each of said first transistors is an NPN bipolar transistor and each of said second transistors is a PNP bipolar transistor.

8. An integrated sample and hold circuit according to claim 4, wherein said first switching means includes at least a diode and a resistor in series.

9. An integrated sample and hold circuit according to claim 4, wherein said first switching means includes a series connection of two diodes.

10. An integrated sample and hold circuit according to claim 9, wherein said first switching means further includes a resistor in parallel combination with said series connection of two diodes.

11. An integrated sample and hold circuit according to claim 10, wherein said first switching means further includes a second resistor in series with said parallel combination.

* * * * *